United States Patent [19]

Chu

[11] Patent Number: 4,510,685
[45] Date of Patent: Apr. 16, 1985

[54] METHOD OF ASSEMBLING MAGNETIC PINS INTO PRINTED CIRCUIT BOARDS

[75] Inventor: Richard Chu, Charlotte, N.C.

[73] Assignee: International Business Machines Corporation, Armonk, N.Y.

[21] Appl. No.: 563,328

[22] Filed: Dec. 19, 1983

[51] Int. Cl.³ .............................................. H05K 3/30
[52] U.S. Cl. ...................................... 29/837; 29/428; 29/744
[58] Field of Search ................. 29/838, 837, 876, 428, 29/464, 466, 744

[56] References Cited

U.S. PATENT DOCUMENTS 3,061,919  11/1962  Tack .
3,386,156  6/1968   Griesemer et al. .
3,501,825  3/1970   Alexander et al. .
3,508,314  4/1970   Powell, Jr. .
3,574,919  4/1971   Reppert .

Primary Examiner—Howard N. Goldberg
Assistant Examiner—Carl J. Arbes
Attorney, Agent, or Firm—Karl O. Hesse

[57] ABSTRACT

Magnetic pins preswaged at an off-center point along their length are assembled into a printed circuit board by energizing a pair of electromagnets, disposed one above and the other beneath the circuit board, to cause the pins scattered over a template to become erect. This results in some of the pins being disposed with their shanks protruding through the holes in a magnetic plate disposed below the circuit board while others of the pins pass through the circuit board but do not protrude below the magnetic plate. Increasing the energization of the upper magnet causes the non-protruding pins to be ejected from the circuit board. Subsequent deenergization of the upper magnet results in further pins becoming disposed with their shanks protruding through the magnetic plate. The energization cycle of the magnets is repeated until the circuit board contains a pattern of pins defined by the template with all the pins oriented so that they protrude through the magnetic plate.

6 Claims, 7 Drawing Figures

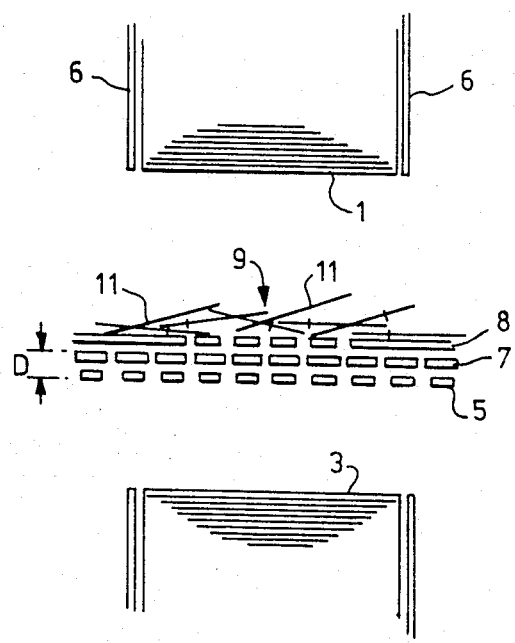
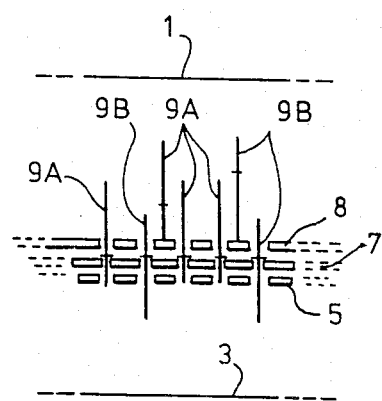
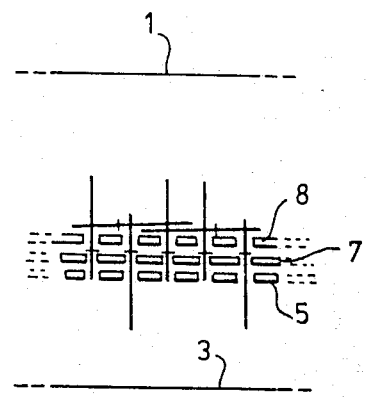
FIG. 1
FIG. 2
FIG. 3

METHOD OF ASSEMBLING MAGNETIC PINS INTO PRINTED CIRCUIT BOARDS

DESCRIPTION

The present invention is concerned with a method of assembling asymmetrically preswaged magnetic pins into a pattern of perforations in a printed circuit board.

BACKGROUND

Magnetic pins can be erected by a magnetic field and then allowed to drop through a perforated template into holes in a printed circuit board. However, when the pins are preswaged at an off-center point some of the pins assembled into the printed circuit board will protrude further from one side of the board than others of the pins protrude from that side of the board.

DISCLOSURE OF THE INVENTION

It is the object of the invention to provide a method of assembling asymmetrically preswaged magnetic pins into a circuit board so that all the pins protrude essentially the same distance from the underside of the board.

In accordance with the invention there is provided a method of assembling asymmetricaly preswaged pins into a pattern of perforations in a printed circuit board, each perforation in the printed circuit board being of such a size that the shank of a pin is a free fit therein but the swage of the pin will not pass into the perforation, the method comprising the successive steps of:
- (a) providing a sheet of magnetic material having a pattern of perforations corresponding to the pattern of perforations in the printed circuit board, each perforation in the sheet of magnetic material allowing free passage of the shank of a pin therein;
- (b) placing the printed circuit board over the perforated sheet of magnetic material so that the perforations in the printed circuit board are aligned with the perforations in the sheet of magnetic material, the distance between the lower surface of the sheet of magnetic material and the upper surface of the printed circuit board being arranged to be substantially equal to or greater than the distance between the swage on each pin and the end of the pin closer to the swage and less than the distance between the swage on each pin and the end of the pin further from the swage;
- (c) placing on top of said circuit board a template provided with a pattern of perforations corresponding to a particular pin pattern for said circuit board with the perforations in said template aligned with those in said circuit board;
- (d) scattering pins over the template;
- (e) generating a first magnetic field generally perpendicular to the printed circuit board so that the pins are aligned with the lines of force of the magnetic field, the strength of the first magnetic field being sufficient to align the pins but insufficient to levitate the pins so that the pins fall into the perforations in the printed circuit board;
- (f) generating a second magnetic field generally perpendicular to the printed circuit board of such a strength and direction that the pins which are oriented so that their shanks do not extend beyond the lower surface of the sheet of magnetic material are ejected from the printed circuit board; and repeating steps (e) and (f) until there is in essentially each of the perforations in the printed circuit board corresponding to the perforations in the perforation pattern in the template, a pin oriented so that its shank extends beyond the lower surface of the sheet of magnetic material.

BRIEF DESCRIPTION OF THE DRAWINGS

FIG. 1 is a diagram of apparatus for inserting asymmetrically preswaged magnetic pins into apertures in a printed circuit board.

FIGS. 2 through 7 represent successive stages in producing a pinned circuit board using the apparatus shown in FIG. 1.

DESCRIPTION OF BEST MODE OF CARRYING OUT THE INVENTION

Figure 4:
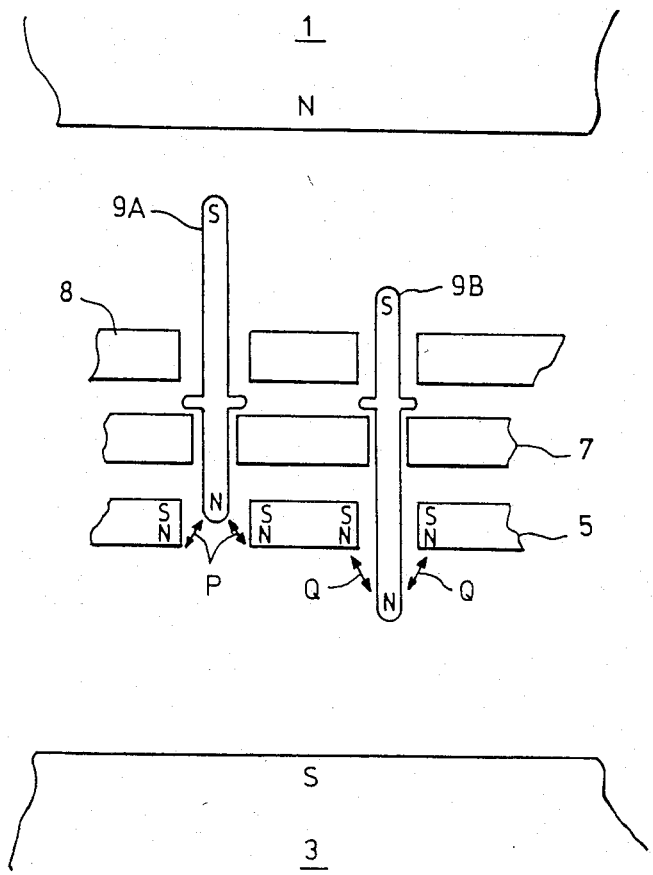

A pin insertion apparatus (FIG. 1) comprises an upper electromagnetic 1 and a lower electromagnet 3. The electromagnets 1 and 3 are independently energisable and disposed between them is a perforated steel plate 5. The perforations in plate 5 are disposed in positions corresponding to all the possible positions in which pins could be inserted in a printed circuit board 7. Preferably, the perforations in steel plate 5 have a diameter about three times that of the shanks of the magnetic pins 9 to be inserted in the circuit board.

It is desirable that the sides 6 of the upper electromagnet be shielded with magnetic material to reduce fringing of the magnetic field.

It is to be noted that each of the pins 9 is preswaged at a point 11 which is off-center and that it is desired to produce a pinned circuit board in which all of the pins are oriented so that they protrude further on the lower side of the board than they do on the upper side of the board.

The apparatus of FIG. 1 is used to produce this desired form of pinned circuit board in the following manner. The circuit board 7 is positioned over the plate 5 so that the perforations in the circuit board are aligned with those in the steel plate, one or more spacers (not shown) being inserted between the circuit board 7 and the steel plate 5 so that the distance D from the top of the circuit board to the underside of the steel plate 5 is essentially equal to the distance between the swage point 11 on the pin 9 and the end of the pin closer to the swage point. A template 8 having a pattern of perforations corresponding to the particular pin pattern desired for the circuit board 7 is placed on top of the circuit board and held with the holes in the template aligned with those in the circuit board and the steel plate 5. The holes in the template 8 are just sufficiently larger than those in the circuit board 7 to provide clearance for the swages of the pins.

With the electromagnets 1 and 3 deenergised, pins 9 are scattered over the template 8. Both the electromagnets 1 and 3 are then energised and together produce a first magnetic field which causes the pins to stand up as shown in FIG. 2. On standing up, some of the pins will have become aligned with holes in the template while the remainder will be disposed over solid parts of the template. Those of the pins that are aligned with holes in the template fall into the holes in the circuit board. The template, the circuit board and the steel plate are slightly shifted together back and forth relative to the electromagnets to assist entry of the pins into the holes in those members. It is to be noted that some 9A of the pins have become oriented with their swage point closer to their lower end while other ones 9B of the pins have assumed the desired orientation with their swage point further away from their lower end. The electromagnets 1 and 3 are then deenergized. As shown in FIG. 3, those of the pins not aligned with the holes fall onto the upper surface of the template. Of the pins 5 which now penetrate the circuit board, those 9A with the undesired orientation do not protrude below the steel plate 5 whereas those pins 9B with the desired orientation do protrude below the steel plate 5.

Figure 5:
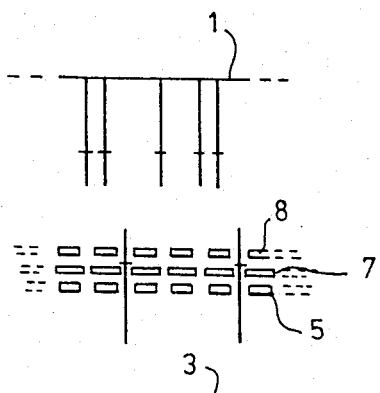
Figure 6:
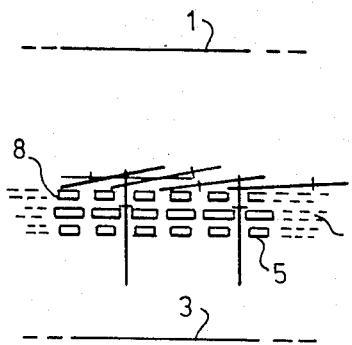

Next, the electromagnets 1 and 3 are energised again, the energisation of the upper electromagnet 1 being greater now than in the initial pin-orienting step described above with reference to FIG. 2. This energisation of the electromagnets 1 and 3 results in the production of a second magnetic field: FIG. 4 indicates the nature of the magnetic poles induced in the steel plate 5 and the pins 9A and 9B penetrating the circuit board. The repulsion of like (N) poles (represented by the double-headed arrows P) at the lower end of the pins 9A and at the lower side of the steel plate 5, assists the attraction between the top of the pins 9A and the upper electromagnet 1 while the repulsion of like (N) poles (represented by the double-headed arrows Q) at the lower end of the pins 9B and at the lower side of the steel plate 5 reduces the attraction between the top of the pins 9B and the upper electromagnet 1. As shown in FIG. 5, the second magnetic field causes the pins 9A with the undesired orientation to be ejected from the circuit board 7 while the pins 9B with the desired orientation are retained in the circuit board. The circuit board 7 and the steel plate 5 are then slightly shifted together relative to the electromagnets 1 and 3 so that the ejected pins are no longer aligned with holes in the template 8. The electromagnets 1 and 3 are then deenergised, or partially deenergised, so that the ejected pins fall onto the upper surface of the template, as shown in FIG. 6.

Figure 7:
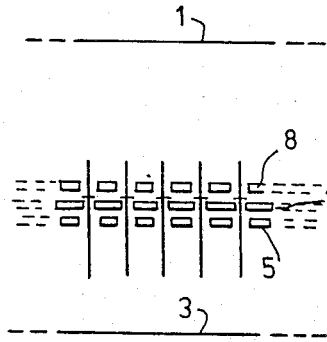

The steps described with reference to FIGS. 2 through 6 are then repeated until there is a pin having the desired orientation in each of the holes in the circuit board corresponding to the perforation pattern of the template, as shown in FIG. 7.

Whilst the use of electromagnets is preferred, either one or both of the electromagnets 1 and 3 can be replaced by a permanent magnet. When the upper electromagnet is replaced by a permanent magnet, the second (increased) magnetic field is generated by moving that permanent magnet closer to the circuit board.

What is claimed is:

1. A method of assembling asymmetrically preswaged pins into a pattern of perforations in a printed circuit board, each perforation in the printed circuit board being of such a size that the shank of a pin is a free fit therein but the swage of the pin will not pass into the perforation, the method comprising the successive steps of:

(a) providing a sheet of magnetic material having a pattern of perforations corresponding to the pattern of perforations in the printed circuit board, each perforation in the sheet of magnetic material allowing free passage of the shank of a pin therein;

(b) placing the printed circuit board over the perforated sheet of magnetic material so that the perforations in the printed circuit board are aligned with the perforations in the sheet of magnetic material, the distance between the lower surface of the sheet of magnetic material and the upper surface of the printed circuit board being arranged to be substantially equal to or greater than the distance between the swage on each pin and the end of the pin closer to the swage and less than the distance between the swage on each pin and the end of the pin further from the swage;

(c) placing on top of said circuit board a template provided with a pattern of perforations corresponding to a particular pin pattern for said circuit board with the perforations in said template aligned with those in said circuit board;

(d) scattering pins over the template;

(e) generating a first magnetic field generally perpendicular to the printed circuit board so that the pins are aligned with the lines of force of the magnetic field, the strength of the first magnetic field being sufficient to align the pins but insufficient to levitate the pins so that the pins drop into the perforations in the printed circuit board;

(f) generating a second magnetic field generally perpendicular to the printed circuit board of such a strength and direction that the pins which are oriented so that their shanks do not extend beyond the lower surface of the sheet of magnetic material are ejected from the printed circuit board;

and repeating steps (e) and (f) until there is in essentially each of the perforations in the printed circuit board corresponding to the perforations in the perforation pattern in the template, a pin oriented so that its shank extends beyond the lower surface of the sheet of magnetic material.

2. A method as claimed in claim 2, in which the distance between the lower surface of the sheet of magnetic material and the upper surface of the printed circuit board is arranged to be substantially equal to the distance between the swage on each pin and the end of the pin closer to the swage.

3. A method as claimed in claim 1 or 2, in which said first and second magnetic fields are generated by a pair of magnets, one disposed above the printed circuit board and the other disposed below the sheet of magnetic material.

4. A method as claimed in claim 3, in which said magnets are electromagnets and the second magnetic field is generated by increasing the energisation of the electromagnet disposed above the printed circuit board.

5. A method as claimed in claim 3, in which the magnets are permanent magnets and the second magnetic field is generated by moving the permanent magnet disposed above the printed circuit board closer to the printed circuit board.

6. A method as claimed in claim 3, in which the magnet disposed below the printed circuit board is a permanent magnet and the magnet disposed above the printed circuit board is an electromagnet and the second magnetic field is produced by increasing the energisation of the electromagnet.

* * * * *